United States Patent [19]

Ito

[11] Patent Number: 4,893,278

[45] Date of Patent: Jan. 9, 1990

[54] SEMICONDUCTOR MEMORY DEVICE INCLUDING PRECHARGE/EQUALIZATION CIRCUITRY FOR THE COMPLEMENTARY DATA LINES

[75] Inventor: Akira Ito, Kunitachi, Japan

[73] Assignee: Hitachi, Ltd., Tokyo, Japan

[21] Appl. No.: 60,334

[22] Filed: Jun. 10, 1987

[30] Foreign Application Priority Data

Jun. 13, 1986 [JP] Japan .................................. 61-135909

[51] Int. Cl.[4] ......................... G11C 7/00; G11C 11/40
[52] U.S. Cl. .................................... 365/203; 365/190
[58] Field of Search ............... 365/190, 203, 189, 226, 365/230, 233, 189.09, 189.11, 230.03

[56] References Cited

U.S. PATENT DOCUMENTS 3,949,385 4/1976 Sonoda .................................. 365/190

Primary Examiner—Gossage Glenn A.
Attorney, Agent, or Firm—Antonelli, Terry & Wands

[57] ABSTRACT

The semiconductor memory has a memory array comprising word lines, complementary data lines orthogonal to the word lines, and static memory cells disposed at intersections of the word lines and between a complementary pair of data lines in a grid-like memory matrix arrangement of rows and columns. There is also included a plurality of precharge circuits for selectively setting one of two adjacent complementary data line pairs to a first voltage and the other one of the two complementary data line pairs to a second voltage, different than the first voltage, and further including equalization circuitry, thereby establishing a short-circuit between the complementary data lines of each pair of complementary data lines.

24 Claims, 6 Drawing Sheets

SEMICONDUCTOR MEMORY DEVICE INCLUDING PRECHARGE/EQUALIZATION CIRCUITRY FOR THE COMPLEMENTARY DATA LINES

BACKGROUND OF THE INVENTION

The present invention relates to a semiconductor memory device, and in particular, to a technology effectively applicable to, for example, a static random access memory (RAM) and the like.

A memory cell of a static RAM using a metal oxide semiconductor field effect transistor (MOSFET) includes, as a basic configuration, a static flip-flop circuit comprising, for example, a pair of driving MOSFETs in which the gates and drains thereof are crosswisely connected with each other and load means disposed on each drain. The drain region of each driving MOSFET is further connected via a transmission gate MOSFET to a data line in a respective pair of complementary data lines, thereby establishing input/output nodes of the memory cell.

A read signal fed from a selected memory cell is transmitted via the pair of complementary data lines and is amplified by means of a sense amplifier circuit using, for example, a differential MOSFET.

On the other hand, there has been a digital processor of the 1-chip type having a built-in static RAM the. In such a digital processor, the static RAM is used, for example, as an arithmetic register and a stack memory. In this case, the processing throughout the digital processor varies depending on the access time of the static RAM integrated therein. To overcome this difficulty, as a method to increase the processing throughout the digital processor by improving the access speed of the static RAM, the half precharge method has already been proposed by Hitachi, Ltd. (the assignee of the present invention; Ser. No. 943,063, now abandoned (M. Uchida)) in which the complementary data lines are charged to a level which is ½ of the power source voltage Vcc.

Figure 9:
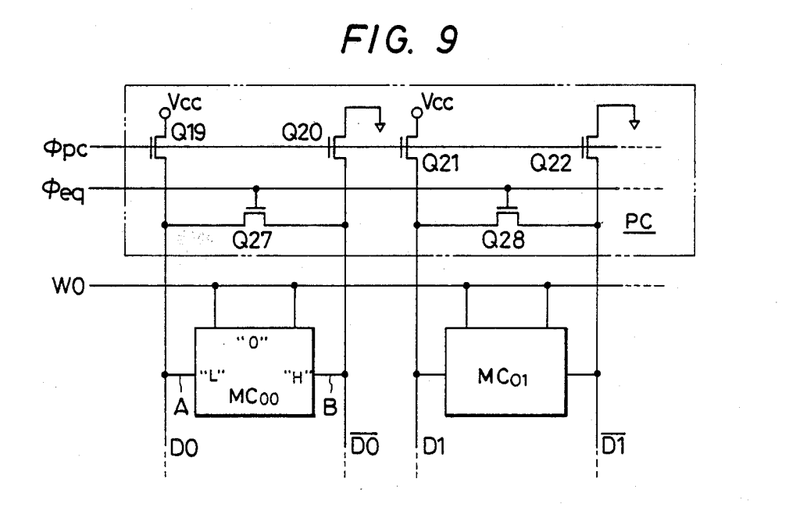
FIG. 9 is a circuit diagram showing an example of the conventional static RAM using the half precharge method.
Figure 10:
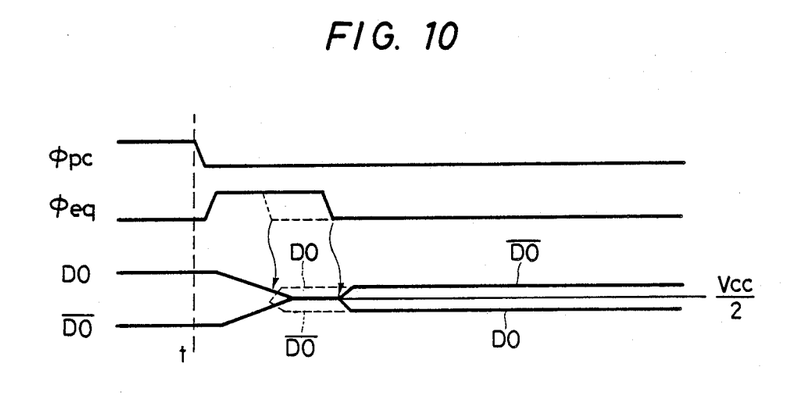
FIG. 10 is a timing chart illustrating the read operation of the static RAM of FIG. 9.

FIGS. 9-10 which relate to copending and commonly assigned U.S. patent application Ser. No. 943,063, filed Dec. 18, 1986, now abandoned, and Ser. No. 212,575, filed June 28, 1988, which is a continuation of Ser. No. 860,411, filed May 7, 1986, now U.S. Pat. No. 4,758,990, are an example of a circuit diagram and a timing chart of the read operation, respectively of a precharge circuit for the static RAM utilizing the precharge method described in the application. In FIG. 9, the input/output nodes of each memory cell MC are respectively connected with a pair of complementary data lines D0 and D0 (D1 and D1). The noninverting signal line D0 (D1) of the pair of complementary data lines D0 and D0 (D1 and D1) is connected via the MOSFET Q19 (Q21) to the power source volatage Vcc, whereas the inverting signal line D0 (D1) thereof is connected via the MOSFET Q20 (Q22) to a grounding potential. Between the noninverting signal line D0 (D1) and the inverting signal line D0 (D1) of the pair of complementary data lines, there is disposed the MOSFET Q27 (Q28) for providing a short circuit (equalization). The gates of the MOSFETs Q19-Q22 are provided with a precharge signal φpc, which is set to the high level when the static RAM is in other than the selected state and which is set to the low level when the static RAM is in the selected state. The gates of the MOSFET Q27-Q28 are supplied with a timing signal φeq, which is temporarily set to the high level at the activation of the static RAM. When the static RAM is set to other than the selected state, the noninverting signal line D0 (D1) and the inverting signal line D0 (D1) of the respective pair of complementary data lines are charged to the power source voltage Vcc and the grounding potential of the circuit, respectively. Moreover, since the noninverting signal line D0 (D1) and the inverting signal line D0 (D1) of the respective pair of complementary data lines are short circuited at the initiation of the static RAM, the charge levels thereof are set to the half precharge level, i.e. Vcc/2. This enables increasing the read signal margin and the read speed of the static RAM.

SUMMARY OF THE INVENTION

The inventor of the present invention has made efforts to increase the operation speed of the static RAM using the half precharge method enabling the development of a high access time and has found the following fact.

That is, in the static RAM adopting such a half precharge method, after the static RAM is initiated, the noninverting signal line D0 (D1) and the inverting signal line D0 (D1) of the respective pair of complementary data lines are short circuited and the equalizing operation described above is achieved; consequently, the access time of the static RAM is extended by a period of time necessary for the equalizing operation. To cope with this situation, if the equalizing time is reduced as indicated by broken lines in FIG. 10, there arises the following problem. Namely, in a case where the period of the high-level state of the timing signal φeq, is reduced to minimize the equalizing time, the operation to select the memory cell is started in a state in which, for example, there still remains a voltage level difference between the noninverting signal line D0 and the inverting signal line D0 of the pair of complementary data lines. As a result, in a memory cell having an undesirable device characteristic storing an information associated with the opposite phase with respect to the potential relationship between the pair of complementary data lines D0 and D0, the memory information may possibly be inverted by the voltage level difference in some cases. In addition, when a memory information is read from a memory cell $MC_{00}$ in which a memory data of the logical "0" has been written, the input/output terminal A of the memory cell $MC_{00}$ connected to the complementary data line D0 is set to the low level, whereas the input/output terminal B connected to the complementary data line D0 is set to the high level. Consequently, when reading "0" from the memory cell, if the voltage level difference with the opposite phase is developed across the pair of complementary data lines D0 and D0, the access time of the static RAM is extended by a period of time necessary for the level inversion of the voltage level difference between the paired complementary data lines. As a result, a sufficient equalizing time must be provided by considering the worst case, which reduces the operation speed of the static RAM.

It is therefore an object of the present invention to provide a semiconductor memory such as a static RAM having an increased operation speed and an improved operational margin.

Another object of the present invention is to provide a digital processor including a semiconductor memory such as a static RAM having an improved cycle time and thereby an increased processing capability.

The above and other objects and the new features of the present invention will become apparent from the description of this specification taken in conjunction with the accompanying drawings.

The outline of representative features described in the application of the present invention are as follows. Namely, the device includes two pairs of complementary data lines adjacent to each other, means for supplying a power source voltage (a first operational potential) of a semiconductor memory to one of the pairs of complementary data lines, means for supplying a grounding potential (a second operational potential) of a semiconductor memory to the other one of the pairs of complementary data lines, and means for equalizing a potential level between the one of the pairs of comlementary data lines and the other one of the pairs of complementary data lines.

According to the means above, even when the equalizing time is reduced so as to minimize the selection timing to select a word line, an unwanted level difference between a noninverting signal line D and an inverting signal line $\overline{D}$ of the paired complementary data lines does not appear, and hence a logic inversion of the information stored in a memory cell other than from input data signals can be prevented. In addition, the operation speed of the semiconductor memory can be increased without lowering the read margin, which further enables implementing a high-speed cycle time and an improved signal processing throughout the digital processor including the semiconductor memory.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

Embodiment 1

Figure 1:
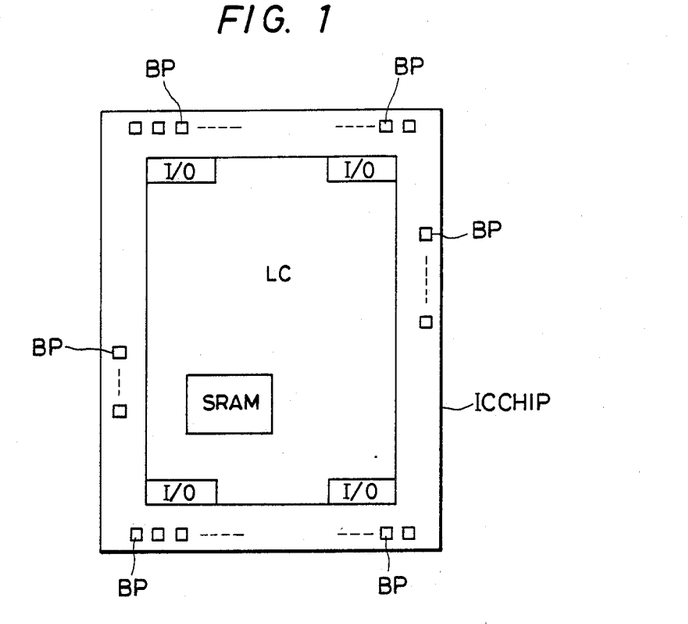
FIG. 1 is a plan view schematically showing an embodiment of a semiconductor substrate (an IC chip) used to mount thereon a digital processor including a static RAM to which the present invention is applied.

FIG. 1 is a plan view illustrating an embodiment of a semiconductor substrate (an IC chip) used to form thereon a static RAM to which the present invention is applied. The static RAM of this embodiment, according to one application but not necessarily limited thereto is built in a digital processor of the 1-chip type. The circuit blocks constituting the digital processor are disposed, but not limited thereto, on the semiconductor substrate formed with crystalline silicon according to known technology for manufacturing complementary MOS (CMOS).

In FIG. 1, a plurality of bonding pads (BPs) are disposed in the peripheral areas of the semiconductor substrate. These bonding pads are coupled to the corresponding external terminals via bonding wires. Some of the bonding pads BPs are coupled to the corresponding individual circuits of an input/output circuit I/O formed at each end section of the semiconductor substrate.

The input/output circuit I/O receives various kinds of input digital signals supplied from external devices and transmits the received signals to the corresponding internal circuits of the digital processor. Moreover, the input/output circuit I/O sends to the external devices various output digital signals delivered from the corresponding internal circuits of the digital processor.

In a large portion of the semiconductor substrate, there is formed a logic circuit section LC including an arithmetic logic unit and various control units of the digital processor. In this embodiment, the static RAM (SRAM) is formed at a predetermined location enclosed with the logic circuit section LC. Although not limited to, the static RAM is used as an arithmetic register and a stack memory of the logic circuit section LC.

Figure 2:
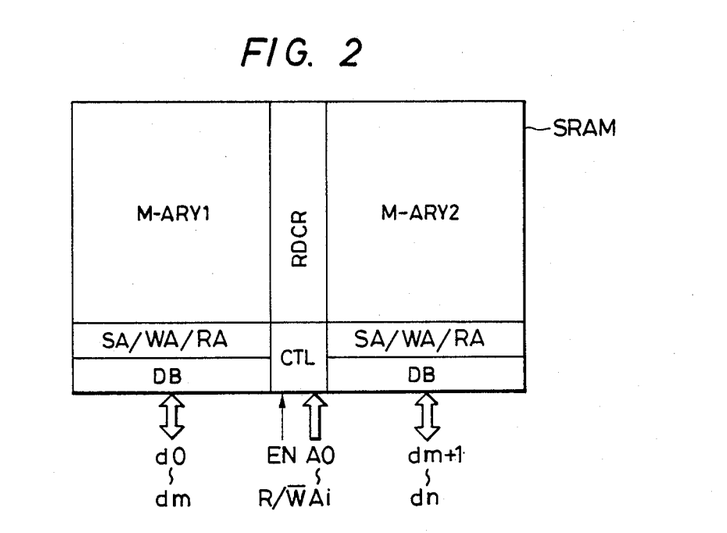
FIG. 2 is a schematic diagram illustrating the arrangement of an embodiment of the static RAM of FIG. 1.

FIG. 2 is a schematic diagram showing the arrangement of an embodiment of the static RAM of FIG. 1.

In FIG. 2, not particularly limited to, the static RAM includes as its basic configuration a paired set of a memory array M-ARY1 and a memory array M-ARY2. Between the memory arrays M-ARY1 and M-ARY2, there is disposed a row address decoder RDCR. The corresponding sense amplifier SA, write amplifier WA, and read amplifier RA are respectively located in a portion beneath each memory array. Moreover, below each amplifier, there is arranged a data buffer DB associated therewith. A control circuit CTL and an address input buffer (not shown) are disposed below the row address decoder RDCR.

The memory arrays M-ARY1 and M-ARY2 each comprise, as will be described later, a plurality of word lines arranged in the horizontal direction in this diagram, a plurality of pairs of complementary data lines disposed in the vertical direction, and memory cells located at intersections in a grid shape or matrix arrangement formed with the word and complementary data lines. The word line constituting each memory array is coupled to the row address decoder RDCR and is alternatively set to the high level indicating the selected state. On the other hand, the paired complementary data lines forming each memory array are coupled via the corresponding sense amplifier to the corresponding write amplifier WA and read amplifier RA, which are further coupled to the associated data buffers DBs.

The static RAM is accessed via an internal bus disposed in the digital processor. The internal bus includes data buses do-dm and dm+1-dn transferring n+1 bits in parallel and a control bus comprising address buses A0-Ai transferring i+1 bits in parallel, an enable signal line EN, and a read/write signal line R/$\overline{W}$. Although not limited to, the static RAM is activated by the enable signal EN and the operation mode thereof is specified by use of the read write signal R/$\overline{W}$. These control signals are supplied to the control circuit CTL of the static RAM. The control circuit CTL, based on these control signals, generates various timing signals to control the internal operations of the static RAM.

The (i+1)-bit address signal supplied via the address bus lines A0-Ai is fed to the address input buffer (not shown) of the static RAM. The address signal is kept in the address input buffer and is then transmitted as a complementary signal to the row address decoder RDCR, which in turn decodes the address signal and then sets the specified word line to the selected state.

On the other hand, the low-order bits D0-Dm and high-order bits Dm+1 to Dn on the data bus correspond to the respective complementary data lines of the memory arrays M-ARY1 and M-ARY2, respectively. Each data bus of do-dn is connected to the corresponding individual circuit of the data buffer DB and is connected via the associated individual circuits of the read amplifier RA and write amplifier WA to the corresponding pair of complementary data lines. Each individual circuit of the data buffer receives the input data supplied via the associated data bus lines do-dn and transmits the data to the corresponding write amplifier WA. Moreover, the individual circuit sends to the corresponding data bus lines do-dn the output data delivered from the corresponding read amplifier RA.

This causes the static RAM to start by use of an enable signal EN and a read or write operation specified by the read/write signal R/$\overline{W}$. In the read or write operation, the static RAM sets the selected state to the word line specified by the address signal A0-Ai. Furthermore, the (n+1)-bit memory data transmitted via the data bus do-dn is simultaneously inputted to or outputted from the n+1 memory cells connected to the word line.

Figure 3:
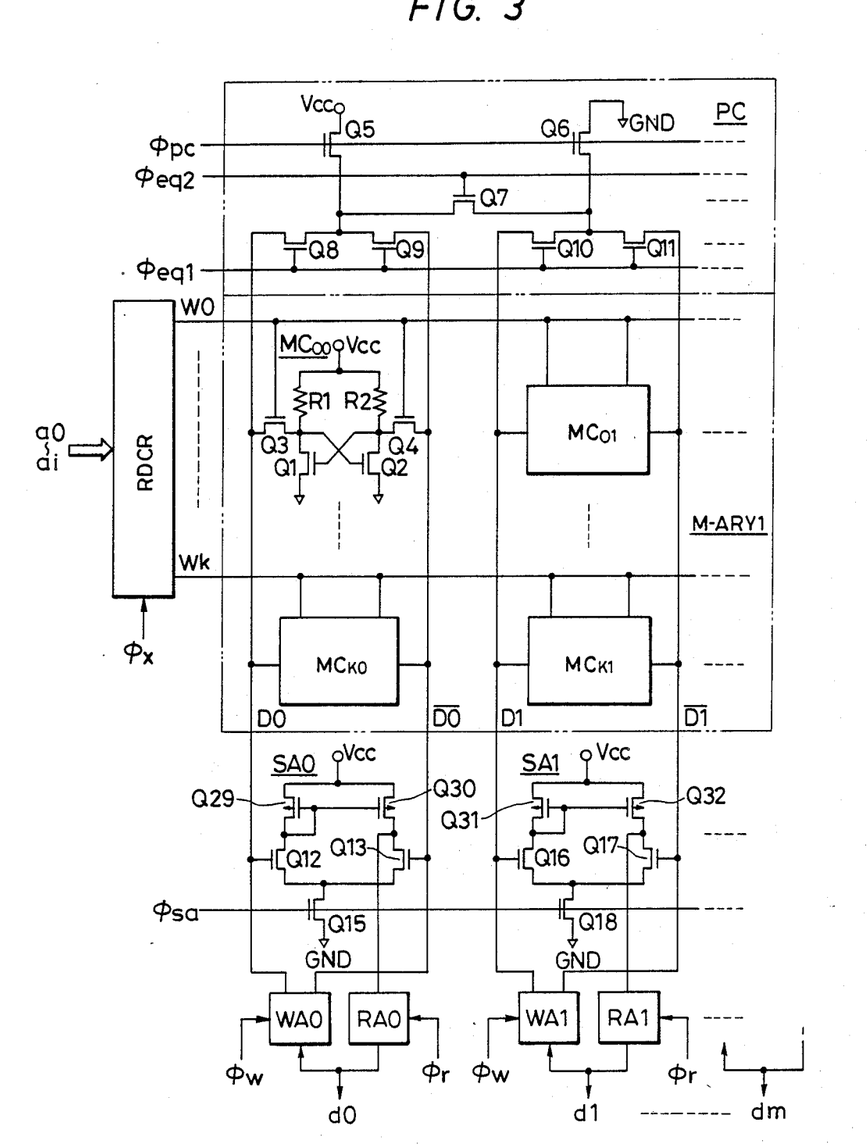
FIG. 3 is a schematic circuit diagram showing an embodiment of a static RAM to which the present invention is applied.

FIG. 3 is a circuit block diagram schematically illustrating an embodiment of the static RAM to which the present invention is applied. In the subsequent diagrams, the MOSFETs indicated with an arrow mark in the channel (back gate) thereof are of the p-channel type, whereas those not indicated with such an arrow mark are of the n-channel type.

Each MOSFET is manufactured, but not limited to, by a so-called self-align technology using as a kind of impurity guide mask the gate electrodes formed with polycrystalline silicon. Although not limited to, the semiconductor substrate on which the static RAM of this embodiment is formed is of an n-type semiconductor substrate. Furthermore, the memory cells of the static RAM are of the high-resistive load type. The MOSFETs constituting these memory cells are of the n-channel type and are formed over the p-type well regions manufactured on the n-type semiconductor substrate. The p-channel MOSFETs are formed on the n-type semiconductor substrate. The p-type well regions are used as the substrate gates of the n-channel MOSFETs and are coupled to the grounding potential of the circuit. Moreover, the n-type semiconductor substrate is used as the common substrate gate of the p-channel MOSFETs and is coupled to the power source voltage Vcc of the circuit. Incidentally, the configuration of the MOSFETs constituting the memory cells MCs formed in the well regions is effective to prevent the software error which may be caused by a radiant ray such as the $\alpha$ ray.

As described above, the static RAM includes a set of two memory arrays, M-ARY1 and M-ARY2. FIG. 3 schematically shows a portion of the memory array M-ARY1 of these memory arrays.

In FIG. 3, the memory array M-ARY1 includes k+1 word lines W0-Wk arranged in the horizontal direction in this diagram, m+1 pairs of complementary data lines D0-$\overline{D0}$ to Dm-$\overline{Dm}$ disposed in the vertical direction of this diagram, and (k+1)×(m+1) memory cells MC$_{00}$-MC$_{km}$ disposed in a matrix shape, namely, at the intersections between these word lines and the complementary data line pairs. Although not limited to, these word lines W0-Wk are formed with a polycrystalline silicon layer.

The word lines W0-Wk constituting the memory array M-ARY1 are linked to the row address decoder RDCR, and one of these word lines is alternatively set to the high level indicating the selected state.

Each memory cell of MC$_{00}$ to MC$_{km}$ is of the same configuration and one of these cells is specifically illustrated as a representative circuit MC$_{00}$ in FIG. 3. In the memory cell MC$_{00}$, the gates and drains of each one of the driver and storage MOSFETs Q1-Q2 are crosswisely connected with each other, the respective sources are connected to the grounding potential of the circuit and the high resistances R1-R2, formed with a polycrystalline silicon layer, are connected between the drains of the MOSFETs Q1-Q2 and the power source terminal Vcc. The drains of the storage MOSFETs Q1-Q2 are used as the input/output terminals of the memory cell MC$_{00}$, and the transmission gate MOSFETs Q3-Q4 are respectively disposed between these input/output terminals and the corresponding paired complementary data lines D0-$\overline{D0}$. The gates such as the transmission gate MOSFETs Q3-Q4 of the memory cell MC$_{00}$ to be arranged in the same row are commonly connected to the corresponding word lines W0-Wk, respectively. The input/output terminals of the memory cells to be disposed in the same column are commonly connected to the associated pairs of data lines D0-$\overline{Do}$ to Dn-$\overline{Dn}$, respectively.

In each memory cell MC, the MOSFETs Q1-Q2 and the resistors R1-R2 form a kind of flip-flop circuit; however, the operating point of this circuit in the information storing state is slightly different from that of a flip-flop circuit in the ordinary sense. That is, to save the power to be consumed by the memory cell MC, the resistors R1 and R2 are respectively set to considerably high resistance values such that when one of the MOSFETs with the drain connected to one of these resistors is off, the gate voltage of the other one of the MOSFETs can be kept slightly higher than the threshold voltage thereof. In other words, the resistors R1-R2 have large enough resistances so as to compensate for the drain leakage currents of the storage MOSFETs Q1-Q2, namely, these resistors R1-R2 are provided with a current supplying capability which compensates for the discharged portion of the information electric charge stored in the gate capacity (not shown) of each MOSFET.

The word lines W0–Wk constituting the memory array M-ARY1 are coupled to the row address decoder, which is similarly coupled to the word lines W0–Wk constituting the memory array M-ARY2. These word lines are alternatively set by the row address decoder RDCR to the high level indicating the selected state.

The row address decoder RDCR is supplied with a timing signal $\phi x$ from the control circuit CTL (not shown) and with internal address signals a0–ai from the address input buffer (not shown). These internal signals are delivered via the address bus A0–Ai to the static RAM and are then configured into a complementary signal by means of the address input buffer.

The timing signal $\phi x$ is set to the low level when the static RAM is in other than the selected state and is set to the high level at a point of time when a predetermined period of time is elapsed after the static RAM is set to the selected state. When the timing signal $\phi x$ is set to the high level, the row address decoder is selectively caused to be operative. In this operative state, the row address decoder RDCR decodes the internal address signals a0–ai and sets a specified word line to the high level indicating the selected state.

On the other side, the paired complementary data lines D0-D0 to Dm-Dm constituting the memory array M-ARY1 are directly linked on one end of each data line to the input terminals of the corresponding unitary circuits SA0, SA1, and the like of the sense amplifier SA. That is, the complementary data lines D0 and D0 are respectively coupled to the gates of the n-channel differential amplifier MOSFETs Q12 and Q13 constituting the sense amplifier SA0. On the drains of the differential amplifier MOSFETs Q12 and Q13, there is coupled an active load circuit including p-channel MOSFETs Q29 and Q30 in a current mirror configuration. Moreover, there is commonly between the sources of the differential amplifier MOSFETs Q12 and Q13 and the grounding potential of the circuit, an n-channel power switch MOSFET Q15 which is controlled by a timing signal $\phi sa$ to the gate. The MOSFET Q15 is turned on when the timing signal $\phi sa$ is set to the high level, which causes the operating current to be supplied to the sense amplifier SA0. The complementary data lines D1 and D1, shown as another representative example, are coupled to the sense amplifier SA1 similarly including n-channel MOSFETs Q16 to Q18 and p-channel MOSFETs Q31 and Q32. The drain voltages of the MOSFETs Q13 and Q17 of these sense amplifiers are supplied as amplifier output signals to the read amplifiers RA0 and RA1, respectively.

The read amplifiers RA0, RA1, etc. are selectively set to the operative state when the timing signal $\phi r$ is set to the high level because the static RAM is set to the read operation mode. In this operative state, the read amplifiers RA1, RA2, etc. transmit to the corresponding data buses do-dm the amplifier output signals supplied from the associated sense amplifiers. When the timing signal $\phi r$ is set to the low level, the outputs of the read amplifiers are set to the high impedance state.

The complementary data lines D0-D0 to Dm-Dm are further coupled to the output terminals of the corresponding write amplifiers WA0, WA1, etc. These write amplifiers WA0, WA1, etc. are selectively set to the operative state when the timing signal $\phi w$ is set to the high level because the static RAM is set to the write operation mode. In the operative state, the write amplifiers WA0, WA1, etc. transmit to the corresponding complementaty data lines D0-D0 to Dm-Dm the complementary write signals included in the write data supplied via the data buses do-dm. In this specification, the data lines on which data having the same phase as that of the data supplied via the data buses do-dm is called noninverting signal lines D, whereas the data lines on which data having the opposite phase as that of the data supplied via the data buses do-dm is called inverting signal lines D. When the timing signal $\phi w$ is set to the low level, the outputs from the write amplifiers WA0, WA1, etc. are set to the high impedance state.

Incidentally, the static RAM of this embodiment is provided with the following precharge circuit PC having as a unit two pairs of complementary data lines adjacent to each other. In the exemplary configuration in FIG. 3, there is shown a portion of a precharge circuit PC diposed corresponding to the two pairs of complementary data lines D0-D0 and D1-D1.

In FIG. 3, between the noninverting signal line D0 and the inverting signal line D0 constituting a complementary data line pair, there are disposed the switch MOSFETs Q8 (first MOSFET) and Q9 (second MOSFET) for establishing a short circuit. Similarly, the MOSFETs Q10 (third MOSFET) and Q11 (fourth MOSFET) for establishing a short circuit are disposed between the noninverting signal line D1 and the inverting signal line D1 constituting another complementary data line pair. Between the nodes commonly connecting one end of the MOSFETs Q8 and Q9 and the first operating potential (power source voltage Vcc), a precharge MOSFET Q5 (sixth MOSFET) is disposed, whereas between the nodes commonly connecting one end of the MOSFETs Q10 and Q11 and the second operating potential (grounding potential) GND, a precharge MOSFET Q6 (seventh MOSFET) is disposed. Between the nodes commonly connected of the MOSFETs Q8 and Q9 and the nodes commonly connecting the MOSFETs Q10 and Q11, there is disposed a short-circuit switch MOSFET Q7 (fifth MOSFET).

The gates of the precharge MOSFETs Q5 and Q6 are supplied with a precharge timing signal $\phi pc$ (third timing signal) to be set to the high level when the static RAM is set to the nonselected state. In addition, the gate of the short-circuit MOSFET Q7 is supplied with an equalization timing signal $\phi eq2$ (second timing signal) to be set to the high level by the time when a predetermined time has elapsed from when the static RAM is set to the selected state. Moreover, the gates of the short-circuit MOSFET Q8 to Q11 are supplied with another equalization timing signal $\phi eq1$ (first timing signal) to be set to the high level during the period of time in which the timing signal $\phi pc$ or $\phi eq2$ is set to the high level, namely, in which the static RAM is in the nonselected state and by the time when the predetermined period of time is elapsed from when the static RAM is set to the selected state.

These MOSFETs Q5 to Q11 are selectively set to the ON state when the corresponding timing signals $\phi pc$, $\phi eq1$, and $\phi eq2$ are set to the high level, respectively.

Figure 4:
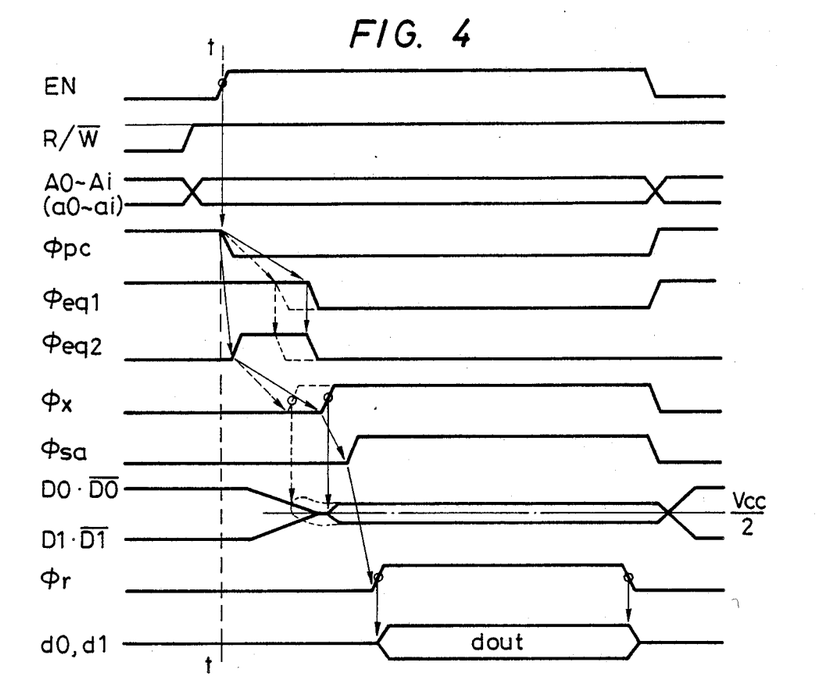
FIG. 4 is a timing chart illustrating the read operation of the static RAM of FIG. 3.

FIG. 4 is a timing chart of an embodiment of the read operation mode in the static RAM of FIG. 3. Referring now to this timing chart and FIG. 3, a description will be briefly given of the read operation in the static RAM. The exemplary description is given in conjunction with two pairs of complementary data lines D0-D0 and D1-D1 of the memory array M-ARY1 and together with a portion of the precharge circuit PC corresponding to each of these complementary data lines. For the other complementary data lines D2-D2 to Dn-Dn, a similar operation is achieved respectively on two pairs of the adjacent complementary data lines.

In FIG. 4, the static RAM of this embodiment, although not limited to, is set to the low level when the enable signal EN is set to the low level. In the static RAM, the timing signals $\phi pc$ and $\phi eq1$ are then set to the high level, whereas the timing signal $\phi eq2$ is set to the low level. This causes the precharge MOSFETs Q5 and Q6 and short-circuit MOSFETs Q8 to Q11 of the precharge circuit PC to simultaneously turn on. As a result, the levels of the noninverting signal line D0 and the inverting signal line D0 of the complementary data line pair are both set to the high level as a result of being coupled to the power source voltage of the circuit via the MOSFETs Q5, Q8, and Q9. Moreover, the levels of the noninverting signal line D1 and the inverting signal line D1 of another adjacent complementary data line pair are both set to the low level as a result of being coupled to the grounding potential GND via the MOSFETs Q6, Q10, and Q11.

The static RAM is set to the selected state when the enable signal EN is set to the high level. Before the enable signal EN is set to the high level, the read/write signal R/$\overline{W}$ is set to the high level and then an address signal is supplied via the address buses A0-Ai as a binary combination arrangement so as to specify a desired word line, which causes the static RAM to be set to the read operation mode. The address signal supplied via the address buses A0-Ai is stored in the address input buffer of the static RAM and is then supplied as the internal address signal a0-ai to the row address decoder.

In the static RAM, when the enable signal EN is set to the high level, the timing signal $\phi pc$ is set to the low level, and thereafter the timing signal $\phi eq$ is temporarily set to and kept remained in the high level for a predetermined period of time.

In the precharge circuit PC, when the timing signal $\phi pc$ is set to the low level, the precharge MOSFETs Q5 and Q6 turn off. Moreover, when the timing signal $\phi eq$ is set to the high level, the shortcircuit MOSFET Q7 turns on. The MOSFET Q7 turns on when the timing signal $\phi eq2$ is set to the high level. The shortcircuit MOSFETs Q8 to Q11 remain on if the timing signal $\phi eq1$ remains at the high level. In addition, the noninverting signal line D0 and the inverting signal line D0 of the complementary data line pair and the noninverting signal line D1 and the inverting signal line D1 of another adjacent complementary data line pair are simultaneously set to the short-circuited state through the MOSFETs Q7 and Q8 to Q11. This equalizes the amount of charges stored in the memory capacities associated with the noninverting signal lines and the inverting signal lines of both complementary data line pairs, and hence all signal lines are set to the half precharge level, namely, substantially equal to ½ of the power source voltage Vcc.

When a predetermined period of time is elapsed after the static RAM is set to the selected state, the timing signals $\phi eq1$ and $\phi eq2$ are simultaneously set to the low level, and thereafter the timing signal $\phi x$ is set to the high level. Moreover, the timing signal $\phi sa$ is set to the high level slightly after the timing signal $\phi x$, and then the timing signal $\phi r$ is set to the high level slightly after the timing signal $\phi sa$.

In the static RAM, when the timing signals $\phi eq1$ and $\phi eq2$ are set to the low level, the short-circuit MOSFETs Q7 to Q11 simultaneously turn off and hence the precharge operation is stopped. In addition, when the timing signal $\phi x$ is set to the high level, the row address decoder RDCR becomes operative and a word line specified by the address signal A0-Ai is selectively set to the selected state. As a result, read signals are delivered from the memory cell coupled to the selected word line, according to the storage data thereof. The read signals are transmitted via the corresponding complementary data lines to the associated sense amplifiers SA0, SA1, etc. When the timing signal $\phi sa$ is set to the high level, the sense amplifiers SA0, SA1, etc. are simultaneously set to the operative state and amplify the read signals read from the corresponding memory cell MC. At the same time, the levels of the complementary data lines D0-D0 and D1-D1 thus paired change from the half precharge level to the high or low level according to the storage data of the selected memory cell. Consequently, the signal amplitude on each data line is reduced and a high-speed read operation is achieved.

The output signals from the respective sense amplifiers are sent to the associated read amplifiers RA0, RA1, etc and are then transmitted to the associated data buses do-dn when the timing signal $\phi r$ is set to the high level.

As described above, two adjacent complementary data line pairs are treated as a set in the static RAM of this embodiment. When the static RAM is set to the nonselected state, both signal lines of a complementary data line pair are set to the high level such as the power source voltage Vcc of the circuit, and both signal lines of another adjacent complementary data line pair are set to the low level such as the grounding potential of the circuit. The complementary data lines of both pairs are simultaneously set to the short-circuit state and the levels thereof are set to the half precharge level by the time when a predetermined period of time is elapsed from when the static RAM is set to the selected state. Consequently, as indicated with broken lines in FIG. 4, the problems of the wrong write operation, the margin reduction, etc. can be removed even in a case where a high-speed access time is to be realized in the static RAM by minimizing the high-level period of the timing signal $\phi eq2$ to be a minimum required value and by setting the timing signal $\phi x$ to the high level at an earlier time. That is, although there appears a level difference between the pairs of the complementary data lines when the high-level period of the timing signal $\phi eq2$ is reduced when the short-circuit period in the precharge circuit PC is minimized as described above, the noninverting signal lines and the inverting signal lines of the respective complementary data line pairs coupled to the input/output nodes of the memory cell are set to the same level. Consequently, the levels of the the noninverting signal lines and the inverting signal lines of the respective complementary data line pairs are changed from the same level to the high or low level when the operation to select a word line is initiated. As a result, a high-speed operation of the static RAM can be implemented while preventing erroneous write operation and the reduction of the read signal margin.

Embodiment 2

Figure 5:
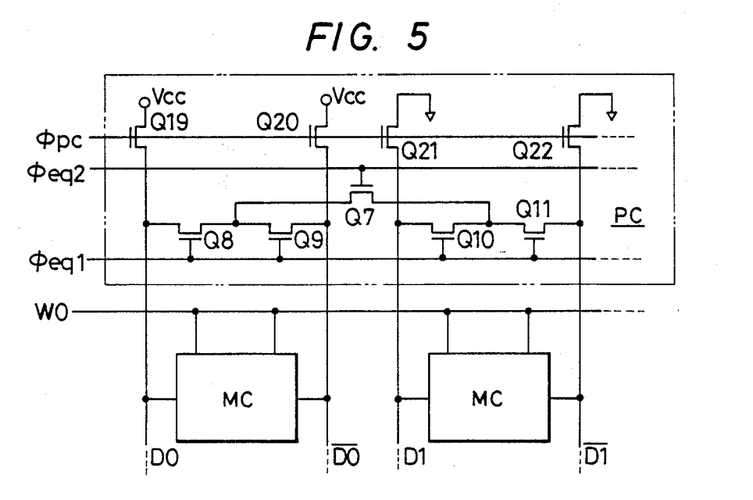
FIG. 5 is a circuit diagram depicting a second embodiment of the static RAM to which the present invention is applied.

FIG. 5 is a schematic circuit diagram of a second embodiment of the static RAM to which the present invention is applied. In this embodiment, since the configurations and operations of the circuit blocks excepting the precharge circuit PC of the static RAM are the same as those of the embodiment of FIG. 3, the explanation thereof will be omitted.

In FIG. 5, in the precharge circuit PC of the static RAM of this embodiment, between the noninverting signal line D0 and the inverting signal line D0 of a set of the complementary data lines and the power source voltage Vcc of the circuit, there are provided precharge MOSFETs Q19 (eighth MOSFET) and Q20 (ninth MOSFET), respectively. Moreover, between the noninverting signal line D1 and the inverting signal line D1 of another set of complementary data lines and the grounding potential of the circuit, there are provided precharge MOSFETs Q21 (10-th MOSFET) and Q22 (11-th MOSFET), respectively. The gates of these precharge MOSFETs are commonly supplied with the timing signal $\phi pc$. Similarly to the embodiment of FIG. 3, between the noninverting signal lines and the inverting signal lines of the respective complementary data line pairs, there are disposed short-circuit MOSFET pairs Q8, Q9, and Q10, Q11. Moreover, a short-circuit MOSFET Q7 is formed between the nodes commonly connecting the short-circuit MOSFETs of the respective complementary data lines. The gates of the short-circuit MOSFETs Q8 to Q11 are supplied with the timing signal $\phi eq1$, whereas the gate of the short-circuit MOSFET Q7 is supplied with the timing signal $\phi eq2$. The timing signals $\phi pc$, $\phi eq1$, and $\phi eq2$ are generated under the same conditions as for the embodiment of FIG. 3.

When the static RAM of this embodiment is in the nonselected state, the timing signals $\phi pc$ and $\phi eq1$ are set to the high level, which causes the precharge MOSFETs Q19 to Q22 and the short-circuit MOSFETs Q8 to Q11 to simultaneously turn on. As a result, both signal lines of the complementary data lines D0-D0 are precharged to the power source voltage Vcc and both signal lines of the complementary data lines D1-D1 are precharged to the grounding potential of the circuit.

Next, when the static RAM is set to the selected state, the timing signal $\phi pc$ is set to the low level and the timing signal $\phi eq2$ is then set to the high level. This causes the precharge MOSFETs Q19 to Q22 to simultaneously turn off, and then the short-circuit MOSFET Q7 turns on. Consequently, both signal lines of the complementary data lines D0-D0 and D1-D1 are set to the short-circuited state and are set to the half precharge level, which is for example, substantially equal to Vcc/2.

When a predetermined period of time is elapsed from when the static RAM is set to the selected state, the timing signals $\phi eq1$ and $\phi eq2$ are both set to the low level. As a result, the short-circuit MOSFETs Q7 to Q11 entirely turn off and then the word line select operation and the storage data read operation are started.

In the case of this embodiment, the same effect as that of the embodiment of FIG. 3 can be attained, and the noninverting signal line and the inverting signal line of each complementary data line pair are precharged via precharge MOSFETs disposed corresponding thereto. This prevents the level difference from appearing between the noninverting signal line and the inverting signal line of each complementary data line pair due to the device characteristics of the short-circuit MOSFETs Q8 to Q11; furthermore, the speed of precharge operation is increased. As a result, the write operation and the read operation of the static RAM are further stabilized and the operation speed thereof is increased.

Embodiment 3

Figure 6:
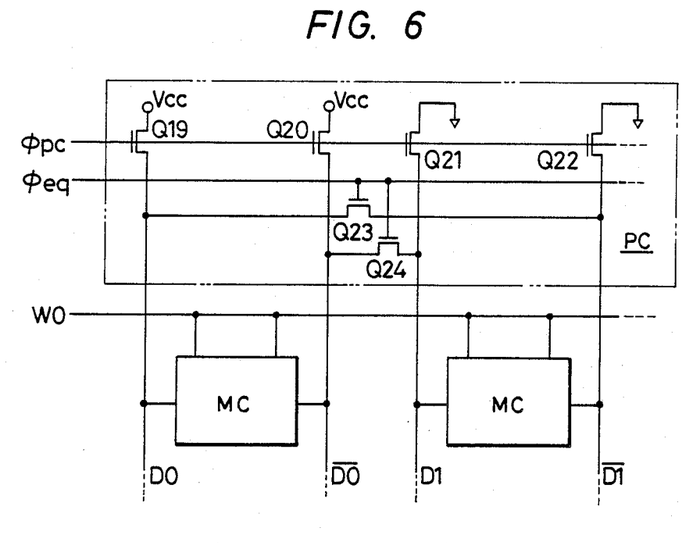
FIG. 6 is a circuit diagram depicting a third embodiment of the static RAM to which the present invention is applied.

FIG. 6 is a schematic circuit diagram showing a third embodiment of the static RAM to which the present invention is applied. In this embodiment, since the configurations and operations of the circuit blocks excepting the precharge circuit PC of the static RAM are the same as those of the embodiment of FIG. 3, the explanation thereof will be omitted.

Like in the embodiment of FIG. 5, in the precharge circuit PC of the static RAM of this embodiment, between the signal lines of a set of the complementary data lines and the power source voltage Vcc of the circuit and between the signal lines of another set of the complementary data lines and the grounding potential of the circuit, there are respectively provided precharge MOSFETs. Moreover, between the noninverting signal line of one of the data line pairs and the inverting signal line of the other one of the data line pairs and between the inverting signal line of said one of the data line pairs and the noninverting signal line the other one of the data line pairs, there are respectively provided short-circuit MOSFETs.

Namely, in FIG. 6, between the noninverting signal line D0 and the inverting signal line D0 of the complementary data line pairs and the power source voltage Vcc of the circuit, there are provided the precharge MOSFETs Q19 (12-th MOSFET) and Q20 (13-th MOSFET), respectively. Furthermore, between the noninverting signal line D1 and the inverting signal line D1 of the adjacent complementary data line pair and the grounding potential of the circuit there are provided the precharge MOSFETs Q21 (14-th MOSFET) and Q22 (15-th MOSFET), respectively. The gates of these precharge MOSFETs Q19 to Q22 are supplied with the timing signal $\phi pc$. Between the noninverting signal line D0 of a pair of the complementary data lines and the inverting signal line D1 of another pair of the complementary data lines, there is provided a short-circuit MOSFET Q23 (16-th MOSFET). Similarly, a short-circuit MOSFET 24 (17-th MOSFET) is disposed between the inverting signal line D0 of the pair of the complementary data lines and the noninverting signal line D1 of the adjacent pair of the complementary data lines. The gates of these short-circuit MOSFETs Q23 and Q24 are supplied with the timing signal $\phi eq$. The timing signals $\phi pc$ and $\phi eq$ are generated under the same conditions as those of the embodiment of FIG. 3.

In the precharge circuit of the static RAM of this embodiment, when the static RAM is set to the nonselected state, the timing signal $\phi pc$ is set to the high level and the timing signal $\phi eq$ is set to the low level. This causes the precharge MOSFETs Q19 to Q22 to simultaneously turn on and the short-circuit MOSFETs Q23 and Q24 to simultaneously turn off. Consequently, both signal lines of the complementary data lines D0-D0 are precharged to the power source voltage Vcc, whereas both signal lines of the complementary data lines D1-D1 are precharged to the grounding potential of the circuit.

Next, when the static RAM is set to the selected state, the timing signal $\phi pc$ is set to the low level and the timing signal $\phi eq$ is then set to the high level. This causes the precharge MOSFETs Q19 to Q22 to simultaneously turn off, and then the short-circuit MOSFET Q23 and Q24 turn on. Consequently, the noninverting signal line D0 of one of the pairs of the complementary data lines and the inverting signal line D1 of the other one of the pairs of the complementary data lines are set to the short-circuited state; furthermore, the inverting signal line D0 of said one of the pairs of the complementary data lines and the noninverting signal line D1 of the other one of the pairs of the complementary data lines are set to the short-circuited state. These signal lines are set to substantially the same half precharge level.

When a predetermined period of time is elapsed from when the static RAM is set to the selected state, the timing signal $\phi$eq is set to the low level. This causes the short-circuit MOSFETs Q23 and Q24 to turn off and then the word line select operation and the storage data read operation are started.

In the case of this embodiment, only by providing the precharge circuit PC with a relatively small number of MOSFETs, the same effect as that of the embodiment of FIG. 3 can be attained, which simplifies the precharge circuit PC and reduces the number of circuit elements.

Embodiment 4

Figure 7:
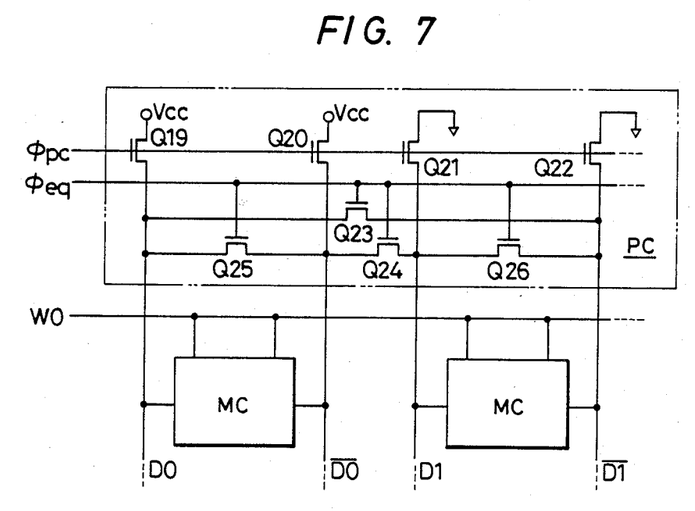
FIG. 7 is a circuit diagram depicting a fourth embodiment of the static RAM to which the present invention is applied.

FIG. 7 is a schematic circuit diagram of a fourth embodiment of the static RAM to which the present invention is applied. In this embodiment, since the configurations and operations of the respective circuit blocks excepting the precharge circuit PC of the static RAM are the same as those of the embodiment of FIG. 3, the description thereof will be omitted.

The precharge circuit PC of the static RAM in this embodiment is structured basically in the same configuration as for the embodiment of FIG. 6. In addition to the configuration of the embodiment of FIG. 6, there are provided in this embodiment short-circuit MOSFETs respectively between the noninverting signal lines and the inverting signal lines in each of the respective pairs of complementary data lines.

Namely, in FIG. 7, between the noninverting signal line D0 and the inverting signal line D0 of the pair of two complementary data lines adjacent to each other and the power source voltage Vcc of the circuit, precharge MOSFETs Q19 and Q20 are respectively disposed as in the embodiment of FIG. 6. In addition, between the noninverting signal line D1 and the inverting signal line D1 of the other pair of two complementary data lines adjacent to each other and the grounding potential of the circuit, precharge MOSFETs Q21 and Q22 are respectively disposed. The gates of these precharge MOSFETs Q19 to Q22 are suplied with the timing signal $\phi$pc. Like in the embodiment of FIG. 6, between the noninverting signal line D0 of one of the complementary data line pairs and the inverting signal line D1 of the other one thereof, a short-circuit MOSFET Q23 is disposed, whereas between the inverting signal line D0 of said one of the complementary data line pairs and the noninverting signal line D1 of the other one thereof, there is disposed a short-circuit MOSFET Q24. Moreover, in the precharge circuit PC of this embodiment, between the noninverting signal line D0 and the inverting signal line D0 of one of two complementary data line pairs, a short-circuit MOSFET Q25 (18-th MOSFET) is disposed, whereas between the noninverting signal line D1 and the inverting signal line D1 of the other one of the complementary data line pairs, there is disposed a short-circuit MOSFET Q26. The gates of these short-circuit MOSFETs Q23 to Q26 are supplied with the timing signal $\phi$eq. The timing signals $\phi$pc and $\phi$eq are generated under the same conditions as for the embodiment of FIG. 6.

In the precharge circuit PC of the static RAM in this embodiment, when the static RAM is set to the selected state, the timing signals $\phi$pc and $\phi$eq are set to the high and low levels, respectively. This causes the precharge MOSFETs Q19 to Q22 to simultaneously turn on and the short-circuit MOSFET Q23 to Q26 to simultaneously turn off. As a result, both signal lines of the complementary data lines D0-D0 are precharged to the power source voltage Vcc, whereas both signal lines of the complementry data lines D1-D1 are precharged to the grounding potential of the circuit.

Next, when the static RAM is set to the selected state, the timing signal $\phi$pc is set to the low level and the timing signal $\phi$eq is set to and kept remained in the high level for a predetermined period of time. This causes the precharge MOSFETs Q19 to Q22 to simultaneously turn off and the short-circuit MOSFETs Q23 to Q26 to simultaneously turn on. As a consequence, both signal lines of the two sets of the paired complementary data lines are simultaneously set to the short-circuit state, and these lines are set to the half precharge level which is substantially equal to Vcc/2.

When a predetermined period of time is elapsed from when the static RAM is set to the selected state, the timing signal $\phi$eq is set to the low level. This causes the short-circuit MOSFETs Q23 to Q26 to turn off, and then the word line select operation and the read operation of the storage data are initiated.

With respect to this embodiment, both signal lines of the two sets of complementary data lines adjacent to each other are respectively charged via a precharge MOSFET and are respectively short-circuited via a MOSFET. As a consequence, the precharge operation on both signal lines of each complementary data line pair is executed in a relatively stable fashion and at a high speed; moreover, the short-circuit operation is also achieved at a high speed. This enables the write operation and the read operation of the static RAM to be executed in a further stable manner and at a high speed.

As indicated by these embodiments described above, when the present invention is applied to a static RAM to be built in a digital processor or the like, the following effect can be attained.

(1) After a power source voltage is supplied to both signal lines of one of two sets of complementary data lines adjacent to each other and a grounding potential is supplied to both signal lines of the other one thereof, these complementary data lines are short-circuited for a predetermined period of time from when the static RAM is activated, which enables the minimizing of the time required for the precharge operation without causing a voltage level difference between the noninverting signal line and the inverting signal line of the respective complementary data line pair.

(2) Since the period of time necessary for the precharge operation can be reduced without developing a voltage level difference between the noninverting signal line and the inverting signal line of the respective complementary data line pair, the write operation of the static RAM can be conducted at a high speed while preventing the erroneous write operation on the memory cell.

(3) Since the period of time necessary for the precharge operation can be reduced without developing a voltage level difference between the noninverting signal line and the inverting signal line of the respective complementary data line pair, the read operation of the static RAM can be achieved at a high speed while retaining the read signal margin.

While the present invention implemented by the present inventor has been specifically described with reference to the embodiments, it is not restricted by those embodiments. It is to be appreciated that those skilled in the art can modify and change the embodiments without departing from the scope and spirit of the invention. For example, in the memory cells MC$_{00}$ to MC$_{kl}$, p-channel MOSFETs may be used in place of the high-resistance loads. The structure may be configured with two sets of CMOS inverter circuits of which the input terminals and the output terminals are crosswise connected to each other. Moreover, there may be provided a column system select circuit between the respective complementary data lines and each amplifier so as to selectively connect a plurality of complementary data lines to the respective amplifiers. In the embodiments of FIGS. 3-7, the precharge circuits PCs are configured by use of n-channel MOSFETs; however, p-channel MOSFETs or a complementary switch MOSFET in which an n-channel MOSFET and a p-channel MOSFET are connected in parallel may be used at the same time.

Figure 8:
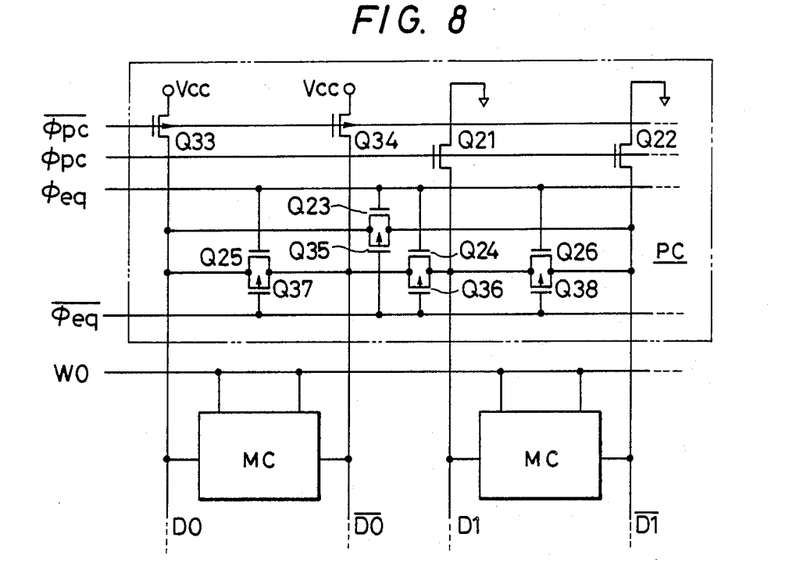
FIG. 8 is a circuit diagram depicting a fifth embodiment of the static RAM to which the present invention is applied.

That is, in the embodiment of FIG. 8, the precharge circuit PC is structured in the same configuration as for the embodiment of FIG. 7. In this embodiment, in place of the n-channel precharge MOSFETs Q33 and Q34 are disposed. In addition, for the n-channel short-circuit MOSFETs Q23 to Q26, p-channel short-circuit MOSFETs Q35 to Q38 are disposed in the parallel fashion. Namely, MOSFETs Q23 and Q35, Q24 and Q36, Q25 and Q37, and Q26 and Q38 are respectively structured in a complementary switch MOSFET configuration. The gates of the MOSFETs Q33 and Q34 are supplied with a signal $\overline{\phi pc}$ obtained by inverting the timing signal $\phi pc$. Moreover, the gates of the MOSFETs Q35 to Q38 are commonly supplied with a signal $\overline{\phi eq2}$ obtained by inverting the timing signal $\phi eq2$. This causes the precharge MOSFETs Q33 and Q34 and the n-channel precharge MOSFETs Q21 and Q22 to simultaneously turn on, and the noninverting signal line D0 and the inverting signal line $\overline{D0}$ of one of the corresponding two sets of complementary data lines are set to the high level such as the power source voltage Vcc of the circuit. In this situation, the high level of the noninverting signal line D0 and the inverting signal line $\overline{D0}$ is not lowered by the threshold voltage of the respective precharge MOSFET. On the other hand, the short-circuit p-channel MOSFETs Q35 to Q38 and the short-circuit n-channel MOSFETs Q23 to Q26 simultaneously turn on, which causes the noninverting signal lines and the inverting signal lines of the associated two sets of complementary data lines to be set to the short-circuited state. In this operation, since each short-circuit MOSFET is structured in the complementary switch MOSFET configuration, the conductance thereof is minimized, and hence the speed of the short-circuit operation of the precharge circuit PC is further increased.

As described above, the precharge MOSFET is formed in the p-channel MOSFET configuration and the short-circuit MOSFET is structured in the complementary switch MOSFET configuration, which is also applicable with respect to the embodiments of FIGS. 3-6.

The specific circuits of the precharge circuit of FIGS. 3-8 may be implemented in various configurations. Moreover, the structure of the static RAM block, the specific circuit of the sense amplifier SA, and combinations of the timing signals and address signals of FIG. 3 may be implemented in various configurations.

Although the foregoing description has been given of a case where the present invention is applied to the static RAM to be built in a digital processor such as a microcomputer which is the field of technology as the background of the present invention, the present invention is not restricted by the description but it is applicable to, for example, various semiconductor memories to be separately used as static RAMs, external storage devices, etc. which are built in a digital communication controller and the like.

Although the present invention has been described in conjuction with a semiconductor memory formed on a silicon substrate, it can also be applied to a semiconductor memory formed on a chemical semiconductor substrate manufactured with, for example, GaAs.

The present invention is widely applicable to a semiconductor memory having at least a complementary data line pair and using the half precharge methods and a digital apparatus in which such a semiconductor memory is integrated.

While the present invention has been described with reference to the particular illustrative embodiments, it is not restricted by those embodiments but only by the appended claims. It is to be appreciated that those skilled in the art can change and modify the embodiments without departing from the scope and spirit of the invention.

What is claimed is:

1. A semiconductor memory device comprising:
   a plurality of word lines and a plurality of complementary data line pairs;
   a plurality of memory cells coupled to said plurality of word lines and said plurality of complementary data line pairs forming a grid-like memory matrix arrangement wherein each memory cell is connected to a word line and to a complementary pair of data lines; and
   a plurality of precharge circuit means for precharging a plurality of complementary data line pairs, each one of said precharge circuit means being coupled so as to precharge two adjacent pairs of said complementary data lines; and each precharge circuit means comprising:
   means for supplying a first voltage to one pair of said two complementary data line pairs,
   means for supplying a second voltage, different than said first voltage, to the other pair of said two complementary data line pairs, and
   equalization means for effecting a short circuit between at least one data line of said one pair of said two complementary data line pairs and at least one data line of said other pair of said two complementary data line pairs wherein there is provided a substantially equal potential at each of the data lines of said two complementary data line pairs during a precharging mode of operation.

2. A semiconductor memory device according to claim 1, wherein each data line of each pair of complementary data lines is respectively coupled to an input terminal of a plural input terminal sense amplifier associated therewith.

3. A semiconductor memory device according to claim 1, wherein said means for supplying said first voltage and said means for supplying said second voltage are responsive to an active phase of a first timing signal corresponding to a period of time in which the semiconductor memory is in a nonselected state and which continues for a predetermined period of time subsequent to said memory being set to a selected state, and wherein said equalization means is responsive to an active phase of a second timing signal corresponding to a second predetermined period of time from when the semiconductor memory is set to the selected state.

4. A semiconductor memory device according to claim 1, wherein each one of said plurality of memory cells consists of a static random access memory cell.

5. A semiconductor memory device according to claim 4, wherein each of said static random access memory cells comprises a pair of insulated gate field-effect transistor type of cross-coupled logic inverters.

6. A semiconductor memory device according to claim 1, wherein in each one of said plurality of precharge circuit means said means for supplying a first voltage, and said means for supplying a second voltage, are comprised of:

first and second MOSFETs and third and fourth MOSFETs, respectively, wherein said first and second MOSFETs are respectively coupled between a noninverting signal line and an inverting signal line corresponding to said one pair of said two complementary data line pairs and a power source voltage and said third and fourth MOSFETs are respectively coupled between a noninverting signal line and an inverting signal line corresponding to said other pair of said two complementary data line pairs and a reference potential and wherein said first, second, third and fourth MOSFETs are selectively switched to the on state in response to an active phase of a first timing signal, and wherein said equalization means of each precharge circuit means is comprised of fifth and sixth MOSFETs, wherein said fifth MOSFET is coupled between the noninverting signal line of said one pair of said two pairs of complementary data lines and the inverting signal line of said other pair of said two complementary data line pairs and said sixth MOSFET is coupled between the inverting signal line of said one pair of said two complementary signal line pairs and the non-inverting signal line of said other pair of said two complementary data line pairs and wherein said fifth and sixth MOSFETs are selectively switched to the on state in response to an active phase of a second timing signal.

7. A semiconductor memory device according to claim 6, wherein:

said first timing signal is set to its active phase during a period of time in which the semiconductor memory is in a nonselected state; and wherein said second timing signal is set to its active phase for a predetermined period of time from when the semiconductor memory is set to a selected state.

8. A semiconductor memory device according to claim 7, wherein in each one of said plurality of precharge circuit means said equalization means further includes:

seventh and eighth MOSFETs, wherein said seventh MOSFET is coupled between the noninverting and inverting signal lines of said one pair of said two complementary data line pairs and said eighth MOSFET is coupled between the noninverting and inverting signal lines of said other pair of said two complementary data line pairs, and wherein said seventh and eighth MOSFETs are selectively switched to the on state in response to the active phase of said second timing signal.

9. A semiconductor memory device according to claim 1, wherein the semiconductor memory device is formed on a semiconductor substrate, and said semiconductor memory device further comprises a logic section having logic blocks and a memory block for said grid-like memory matrix arrangement of memory cells, and wherein said logic section blocks and said memory block are coupled together via internal buses.

10. A semiconductor memory device according to claim 9, further including peripheral circuits for the semiconductor memory, and wherein said peripheral circuits are coupled to said logic blocks and to the memory block via internal buses.

11. A semiconductor memory device according to claim 10, wherein each one of said plurality of memory cells consists of a static random access memory cell.

12. A semiconductor memory device according to claim 11, wherein said grid-like memory matrix arrangement includes a paired set of a first memory array and a second memory array having disposed therebetween a row selection circuit.

13. A semiconductor memory device according to claim 1, wherein in each one of said plurality of precharge circuit means said equalization means comprises:

first, second, third, and fourth MOSFETs, wherein said first and second MOSFETs are coupled in series between inverting and noninverting signal lines associated with said one pair of said two complementary data line pairs and said third and fourth MOSFETs are coupled in series between inverting and noninverting signal lines associated with said other pair of said complementary data line pairs, wherein said first, second, third and fourth MOSFETs are selectively switched to the one state in response to an active phase of a first timing signal, and a fifth MOSFET which is coupled between a common node connection of said first and second MOSFETs and a common node connection of said third and fourth MOSFETs and is selectively switched to the on state in response to an active phase of a second timing signal.

14. A semiconductor memory device according to claim 13, wherein:

said first timing signal is set to its active phase during a period of time in which the semiconductor memory is in a nonselected state and which continues in its active phase until a predetermined period of time elapses after said memory is set to a selected state, and wherein said second timing signal is set to its active phase during a period of time when the semiconductor memory is set to the selected state to when the predetermined period of time elapses.

15. A semiconductor memory device according to claim 14, wherein in each one of said plurality of precharge circuit means said means for supplying a first voltage and said means for supplying a second voltage are comprised of:

sixth and seventh MOSFETs, respectively, wherein said sixth MOSFET is coupled between said common node connection of said first and second MOSFETs and a power source voltage and said seventh MOSFET is coupled between said common node connection of said third and fourth MOSFETs and a reference potential, wherein said sixth and seventh MOSFETs are selectively switched to the on state in response to an active phase of a third timing signal, and wherein said third timing signal is set to its active phase during a period of time in which the semiconductor memory is in the nonselected state.

16. A semiconductor memory device according to claim 14, wherein in each one of said plurality of precharge circuit means said means for supplying a first voltage and said means for supplying a second voltage are comprised of:

sixth and seventh MOSFETs and eighth and ninth MOSFETs, respectively, wherein said sixth and seventh MOSFETs are respectively coupled between the inverting and noninverting signal lines of said one pair of said two complementary data line pairs and a power source voltage, and said eighth and ninth MOSFETs are respectively coupled between the inverting and noninverting signal lines of said other pair of said two complementary data line pairs and a reference potential and wherein said sixth through ninth MOSFETs are selectively switched to the on state in response to an active phase of a third timing signal, and wherein said third timing signal is set to its active phase during a period of time in which the semiconductor memory is in the nonselected state.

17. A semiconductor memory device according to claim 1, wherein in each one of said plurality of precharge circuit means said means for supplying a first voltage, and said means for supplying a second voltage, are comprised of:

first and second MOSFETs and third and fourth MOSFETs, respectively, wherein said first and second MOSFETs are respectively coupled between a noninverting signal line and an inverting signal line corresponding to said one pair of said two complementary data line pairs and a power source voltage and said third and fourth MOSFETs are respectively coupled between a noninverting signal line and an inverting signal line corresponding to said other pair of said two complementary data line pairs and a reference potential and wherein said first, second, third and fourth MOSFETs are selectively set to the on state in response to an active phase of a first timing signal, and wherein said equalization means of each precharge circuit means is comprised of first switching means for short-circuiting the noninverting signal line of said one pair of said two pairs of complementary data line pairs and the inverting signal line of said other pair of said two complementary data line pairs and a second switching means for short-circuiting the inverting signal line of said one pair of said two complementary signal line pairs and the noninverting data line of said other pair of said two complementary data line pairs, and wherein said first and second switching means are selectively switched to the on state in response to an active phase of a second timing signal.

18. A semiconductor memory device according to claim 17, wherein:

said first timing signal is set to its active phase during a period of time in which the semiconductor memory is in a nonselected state, and wherein said second timing signal is set to its active phase for a predetermined period of time from when the semiconductor memory is set to a selected state.

19. A semiconductor memory device according to claim 18, wherein in each one of said plurality of precharge means said equalization means further includes:

third switching means for short-circuiting the noninverting and the inverting signal lines of said one pair of said two complementary data line pairs, fourth switching means for short-circuiting the noninverting and the inverting signal lines of said other pair of said two complementary data line pairs, and wherein said third and fourth switching means are selectively switched to the on state in response to the active phase of said second timing signal.

20. A semiconductor memory device according to claim 19, wherein each of said first, second, third and fourth switching means comprises a pair of parallel-connected complementary MOSFETs.

21. A semiconductor memory device comprising:

a plurality of memory cells;

a plurality of word lines and a plurality of pairs of complementary data lines respectively coupled to said plurality of memory cells, each memory cell being coupled to a word line and to a pair of complementary data lines;

first means for supplying a first operating potential to said semiconductor memory device;

second means for supplying a second operating potential, different than said first operating potential, to said semiconductor memory device;

third means being coupled between said first means and one pair of said plurality of pairs of complementary data lines for selectively supplying the first operating potential to said one pair of complementary data lines;

fourth means being coupled between said second means and another pair of complementary data lines adjacent to said one pair of complementary data lines for selectively supplying the second operating potential to said another pair of complementary data lines; and equalization means coupled through said third and fourth means to at least one data line of said one pair of complementary data lines and at least one data line of said another pair of complementary data lines, respectively, for selectively effecting a short circuit therebetween during a precharging mode of operation wherein there is provided a substantially equal potential at each of the data lines of said one pair and said another pair of complementary data lines.

22. A semiconductor memory device comprising:

a plurality of memory cells;

a plurality of word lines and a plurality of pairs of complementary data lines respectively coupled to said plurality of memory cells, each memory cell being coupled to a word line and to a pair of complementary data lines in an arrangement wherein said plurality of memory cells, said plurality of word lines and said plurality of pairs of complementary data lines form rows and columns of memory cells, each row of memory cells is associated with a respective one of said plurality of word lines and each column of memory cells is associated with a pair of said plurality of complementary data line pairs;

sense amplifiers and write amplifiers, wherein each data line of each pair of complementary data lines is respectively coupled to an input terminal of a plural input terminal sense amplifier associated therewith, and wherein each pair of complementary data lines is coupled via a controllably activated write amplifier to a corresponding data bus and each sense amplifier is coupled to a corresponding data bus via a selectively activated read amplifier;

first means for receiving a first operating potential;

second means for receiving a second operating potential, different than said first operating potential;

third means being coupled between said first means and one pair of said plurality of pairs of complementary data lines for selectively supplying the first operating potential to said one pair of complementary data lines, and fourth means being coupled between said second means and another pair of complementary data lines associated with a column adjacent to said one pair of complementary data lines for selectively supplying the second operating potential to said another pair of complementary data lines, wherein said third means includes first and second switching devices and said fourth means includes third and fourth switching devices, said first and second switching devices being respectively coupled between the inverting and noninverting signal lines of said one pair of said plurality of complementary data line pairs and said first means for receiving a first operating potential, said third and fourth switching devices being respectively coupled between the inverting and noninverting signal lines of said another pair of said plurality of complementary data line pairs and said second means for receiving a second operating potential, wherein said first, second, third and fourth switching devices are concurrently switched to the on state in response to an active phase of a control timing signal, and wherein said control timing signal is set to its active phase during a precharging mode of operation in which the semiconductor memory is in a nonselected state; and equalization means for substantially equalizing the potentials at each of the data lines of said one pair and said another pair of complementary data lines, wherein said equalization means includes fifth, sixth, seventh, eighth and ninth switching devices, said fifth and sixth switching devices being coupled in series between inverting and noninverting signal lines associated with said one pair of complementary data lines and said seventh and eighth switching devices being coupled in series between inverting and noninverting signal lines of said another pair of complementary data lines and said fifth, sixth, seventh and eighth switching devices being selectively switched to the on state in response to an active phase of a first timing signal, and wherein said ninth switching device is coupled between a common node connection of said fifth and sixth switching devices and a common node connection of said seventh and eighth switching devices and is selectively switched to the on state in response to an active phase of a second timing signal.

23. A semiconductor memory device comprising:
a plurality of memory cells;

a plurality of word lines and a plurality of pairs of complementary data lines respectively coupled to said plurality of memory cells, each memory cell being coupled to a word line and to a pair of complementary data lines;

first means for receiving a first operating potential;

second means for receiving a second operating potential, different than said first operating potential;

third means being coupled between said first means and one pair of said plurality of pairs of complementary data lines for selectively supplying the first operating potential to said one pair of complementary data lines, wherein said third means comprises first and second switching devices respectively coupled between a noninverting signal line and an inverting signal line of said one pair of complementary data lines and said first means for receiving a first operating potential;

fourth means being coupled between said second means and another pair of complementary data lines adjacent to said one pair of complementary data lines for selectively supplying the second operating potential to said another pair of complementary data lines, wherein said fourth means comprises third and fourth switching devices respectively coupled between a noninverting signal line and an inverting signal line of said another pair of complementary data lines and said second means for supplying a second operating potential, and wherein said first, second, third and fourth switching devices are selectively switched to the on state in response to an active phase of a first timing signal; and equalization means for substantially equalizing the potentials at each of the data lines of said one pair and said another pair of complementary data lines, wherein said equalization means comprises fifth and sixth switching devices, said fifth switching device being coupled between a noninverting signal line of said one pair of complementary data lines and the inverting signal line of said another pair of complementary data lines and said sixth switching device being coupled between an inverting signal line of said one pair of complementary data lines and a noninverting signal line of said another pair of complementary data lines and wherein said fifth and sixth switching devices are selectively switched to the on state in response to an active phase of a second timing signal.

24. A semiconductor memory device including a digital processor formed on a semiconductor substrate and including a logic circuit having a random access memory, comprising;

a plurality of word lines and a plurality of complementary data line pairs;

a plurality of memory cells coupled to said plurality of word lines and said plurality of complementary data line pairs forming a grid-like memory matrix arrangement wherein each memory cell is connected to a word line and to a complementary pair of data lines; and a plurality of precharge circuit means for precharging said plurality of complementary data line pairs, each one of said precharge circuit means being coupled so as to precharge two adjacent pairs of said complementary data lines, wherein each precharge circuit means comprises:

means for supplying a first voltage to one pair of said two complementary data line pairs, means for supplying a second voltage, different than said first voltage, to the other pair of said two complementary data line pairs, and equalizing means for effecting a short circuit between at least one data line of said one pair of said two complementary data line pairs and at least one data line of said other pair of said two complementary data line pairs during a precharge mode of operation wherein there is provided a substantially equal potential at each of the data lines of said two complementary data line pairs.

* * * * *